(12) United States Patent
Kwon et al.

(10) Patent No.: US 12,399,429 B2
(45) Date of Patent: Aug. 26, 2025

(54) SEMICONDUCTOR FABRICATION APPARATUS

(71) Applicant: SAMSUNG ELECTRONICS CO., LTD., Suwon-si (KR)

(72) Inventors: Ohkug Kwon, Yongin-si (KR);
Sanghun Kim, Seoul (KR); Junghwan Kim, Bucheon-si (KR); Sangbeom Park, Hwaseong-si (KR); Youngduk Suh, Seoul (KR); Jinwook Jung, Suwon-si (KR); Kukbin Choi, Hwaseong-si (KR); Dongkyeng Han, Suwon-si (KR); Tae-Hyun Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 495 days.

(21) Appl. No.: 17/935,157

(22) Filed: Sep. 26, 2022

(65) Prior Publication Data

US 2023/0251576 A1 Aug. 10, 2023

(30) Foreign Application Priority Data

Feb. 8, 2022 (KR) .................. 10-2022-0015922

(51) Int. Cl.
*G03F 7/20* (2006.01)

(52) U.S. Cl.
CPC .......... *G03F 7/2002* (2013.01); *G03F 7/2045* (2013.01)

(58) Field of Classification Search
CPC .. G03F 7/2002; G03F 7/2045; G03F 7/70758; G03F 7/70991; G03F 7/70716

USPC .......................................................... 430/4, 5
See application file for complete search history.

(56) References Cited

U.S. PATENT DOCUMENTS

| | | | |
|---|---|---|---|
| 4,443,657 A | 4/1984 | Hill et al. | |
| 5,245,134 A | 9/1993 | Vana, Jr. et al. | |
| 5,502,287 A | 3/1996 | Nguyen | |
| 7,670,639 B2 | 3/2010 | Gallant et al. | |
| 8,950,714 B2 | 2/2015 | Ikeda et al. | |
| 10,518,511 B2 | 12/2019 | Malloy et al. | |
| 2005/0024621 A1* | 2/2005 | Korenaga | G03F 7/70716 355/75 |

(Continued)

FOREIGN PATENT DOCUMENTS

| | | |
|---|---|---|
| JP | 6090099 | 3/2017 |
| KR | 10-1970827 | 4/2019 |
| WO | 90006010 | 5/1990 |

*Primary Examiner* — Caleen O Sullivan
(74) *Attorney, Agent, or Firm* — Morgan, Lewis & Bockius LLP

(57) ABSTRACT

A semiconductor fabrication apparatus comprising a light source configured to emit light, a substrate stage arranged to receive a substrate exposed to the emitted light, a reticle arranged between the substrate stage and the light source, and a reticle stage arranged to receive the reticle. The reticle stage including a lower plate, an upper plate arranged above the lower plate, an actuator connected to the lower plate configured to move in a direction parallel to the upper plate, a first cable slab arranged between the upper plate and the lower plate and connected to one side of the actuator, and a first cable cover that surrounds an outer periphery of the first cable slab and contacts the lower plate when the first cable slab becomes bent.

20 Claims, 7 Drawing Sheets

(56) References Cited

U.S. PATENT DOCUMENTS

| | | | | |
|---|---|---|---|---|
| 2006/0187439 A1* | 8/2006 | Korenaga | ........... | G03F 7/70716 355/75 |
| 2007/0002785 A1* | 1/2007 | Heo | ................... | G03F 7/70716 370/321 |
| 2017/0108785 A1* | 4/2017 | Aoki | ................... | G03F 7/70816 |
| 2020/0012203 A1* | 1/2020 | Cong | ................. | G03F 7/70758 |
| 2020/0117103 A1* | 4/2020 | Cong | ....................... | G03F 7/20 |

* cited by examiner

SEMICONDUCTOR FABRICATION APPARATUS

CROSS-REFERENCE TO RELATED APPLICATION

This application claims priority under 35 U.S.C § 119 to Korean Patent Application No. 10-2022-0015922 filed on Feb. 8, 2022 in the Korean Intellectual Property Office, the disclosure of which is incorporated by reference herein in its entirety.

TECHNICAL FIELD

Embodiments of the present inventive concept relate to a semiconductor fabrication apparatus, and more particularly, to a semiconductor fabrication apparatus used for photolithography.

DISCUSSION OF RELATED ART

In general, a photolithography process may include a coating process, an exposure process, and a developing process. The exposure process may be a process that transports an image pattern onto a photoresist on a substrate. With an increase in the integration of semiconductor devices, research on the exposure process is being conducted to reduce a wavelength of light used in the exposure process to transport an image pattern onto a photoresist on a substrate. A typical semiconductor fabrication apparatus may include a reticle stage and a substrate stage. Each of the reticle stage and the substrate stage may have a cable slab connected to a controller.

SUMMARY

Embodiments of the present inventive concept provide a semiconductor fabrication apparatus capable of preventing or minimizing abrasion of cable slab.

According to some embodiments of the present inventive concept, a substrate fabrication apparatus may comprise: a light source configured to emit light; a substrate stage that receives a substrate exposed to the light; a reticle arranged between the substrate stage and the light source; and a reticle stage that receives the reticle. The reticle stage may include: a lower plate; an upper plate above the lower plate; an actuator connected to the lower plate, arranged to move in a direction parallel to the upper plate; a first cable slab arranged between the upper plate and the lower plate, the first cable slap being connected to one side of the actuator; and a first cable cover that surrounds an outer periphery of the first cable slab and contacts the lower plate when the first cable slab is bent.

According to some embodiments of the present inventive concept, a semiconductor fabrication apparatus may comprise: a chamber; a light source in the chamber configured to emit light; a substrate stage arranged to receive a substrate exposed to the light; a reticle arranged between the substrate stage and the light source; and a reticle stage that receives the reticle. The substrate stage may include: a lower plate; an upper plate on the lower plate; an actuator connected to the lower plate, actuator moving in a direction parallel to the upper plate; a cable slab arranged between the upper plate and the lower plate, the cable slap being connected to one side of the actuator; and a cable cover that surrounds an outer periphery of the cable slab, the cable cover contacting the lower plate when the cable slab is bent.

According to some embodiments of the present inventive concept, a semiconductor fabrication apparatus may comprise: a light source configured to emit light; a substrate stage that receives a substrate exposed to the light; a reticle between the substrate stage and the light source; and a reticle stage that receives the reticle. The reticle stage may include: a first lower plate; a first upper plate on the first lower plate; a first actuator connected to the first lower plate and moving in a direction parallel to the first upper plate; a first cable slab between the first upper plate and the first lower plate and connected to one side of the first actuator; a first cable cover that surrounds an outer periphery of the first cable slab and contacts the first lower plate when the first cable slab is bent; a second cable slab between the first upper plate and the first lower plate and connected to another side of the first actuator; a second cable cover that surrounds an outer periphery of the second cable slab and contacts the first lower plate when the second cable slab is bent; and a roller vehicle on the first cable slab and the second cable slab, the roller vehicle moving together with the first actuator.

BRIEF DESCRIPTION OF THE DRAWINGS

The above and other features of the inventive concept will be more clearly understood from the following detailed description taken in conjunction with the accompanying drawings, in which.

DETAIL DESCRIPTION OF EMBODIMENTS

Figure 1:
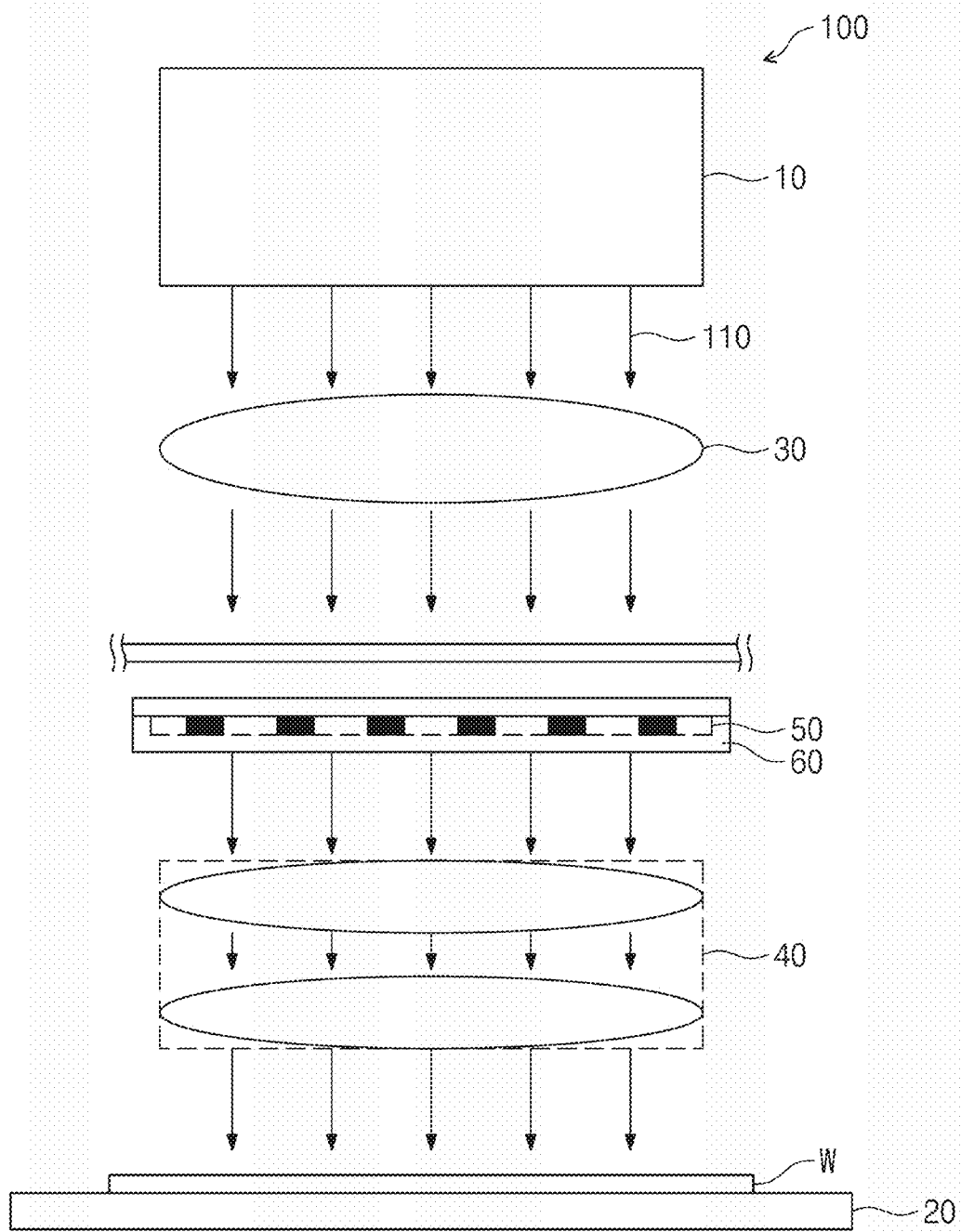
FIG. 1 illustrates a cross-sectional view of a semiconductor fabrication apparatus according to an embodiment of the present inventive concept.

Exemplary embodiments of the present inventive concept will be described more fully hereinafter with reference to the accompanying drawings. Like reference numerals may refer to like elements throughout the accompanying drawings.

FIG. 1 shows an example of a semiconductor fabrication apparatus 100 according to an embodiment of the present inventive concept.

Referring to FIG. 1, a semiconductor fabrication apparatus 100 of the present inventive concept may be embodied, for example, as a scanner exposure device. Alternatively, the semiconductor fabrication apparatus 100 may be embodied as a stepper exposure device. For example, the semiconductor fabrication apparatus 100 may be an ArF exposure device or a KrF exposure device. According to an embodiment, the semiconductor fabrication apparatus 100 may include a light source 10, a substrate stage 20, an illumination optical system 30, a projection optical system 40, a reticle 50, and a reticle stage 60.

The light source 10 may produce and provide light 110 to be emitted towards a substrate W. In an embodiment, the light 110 may include excimer laser light or deep ultraviolet light. For example, the light 110 may have a wavelength of 193 mm (ArF), a wavelength of 248 nm (KrF), a wavelength of 365 nm (I-line), or a wavelength of 436 nm (G-line).

The substrate stage 20 may be provided below the light source 10 and the projection optical system 40. The substrate stage 20 may receive a substrate W. The substrate stage 20 may move the substrate W in a horizontal direction. The substrate W may include a silicon wafer, but the present inventive concept is not limited thereto.

The illumination optical system 30 may be provided between the light source 10 and the substrate stage 20. The illumination optical system 30 may be provided between the light source 10 and the reticle 50. For example, the illumination optical system 30 may include an aperture and a lens. The illumination optical system 30 may be configured to carry out an enlargement projection of the light 110 and/or a reduction projection of the light 110. Alternatively, the illumination optical system 30 may include a mirror, but the present inventive concept is not limited thereto. The illumination optical system 30 may change a path of the light 110 and collimate the light 110.

The projection optical system 40 may be provided between the reticle 50 and the substrate stage 20. The projection optical system 40 may focus light 110 on the substrate W, whereby the focused light 110 penetrates the reticle 50. The projection optical system 40 may include an objective lens (e.g., convex lens).

Reticle 50 may be provided between the illumination optical system 30 and the projection optical system 40. The reticle 50 may be provided in the reticle stage 60. For example, the reticle 50 may be a transmissive photomask. The reticle 50 may project the light 110 on the substrate W.

The reticle stage 60 may receive the reticle 50. The reticle stage 60 may allow the reticle 50 to move in response to a control signal of a controller (See 102 of FIG. 3).

Figure 2:
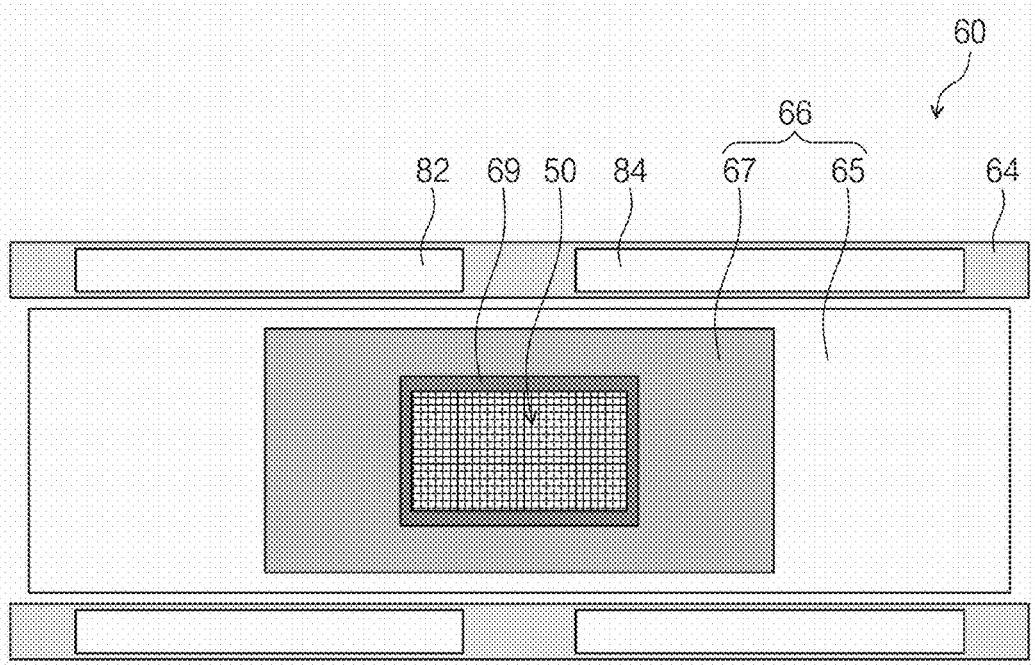
FIGS. 2 and 3 illustrate a plan view and a cross-sectional view of a reticle stage of the semiconductor fabrication apparatus as depicted in FIG. 1.
Figure 3:
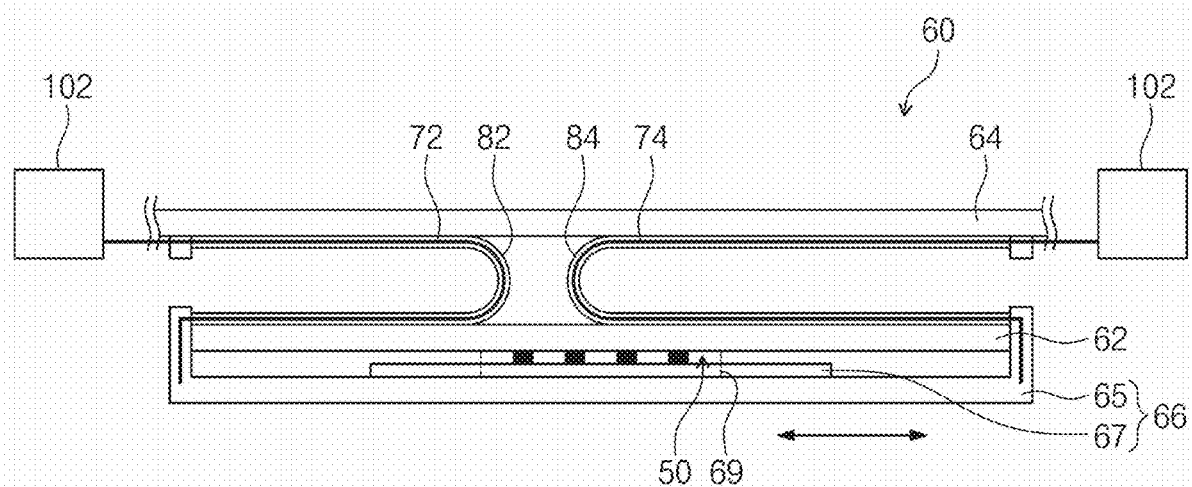

FIGS. 2 and 3 illustrate the reticle stage 60 as depicted in FIG. 1, according to one embodiment.

Referring to FIGS. 2 and 3, the reticle stage 60 may include first lower plates 62, first upper plates 64, a first actuator 66, a first cable slab 72, a second cable slab 74, a first cable cover 82, and a second cable cover 84.

The first lower plates 62 may be correspondingly provided below the first upper plates 64. Although not shown in FIGS. 2 and 3, the first lower plates 62 may be provided on opposite sides of the first actuator 66. The first lower plate 62 may guide a lower portion of the second cable cover 84, the first cable cover 82, the second cable slab 74, and the first cable slab 72. The first lower plate 62 may be a lower guide plate. The first lower plate 62 may move along the first actuator 66. Alternatively, the first lower plate 62 may stop independently of the first actuator 66, but the present inventive concept is not limited thereto.

The first upper plates 64 may be provided on opposite sides of the first actuator 66. The first upper plates 64 may be correspondingly provided on the first lower plates 62. The first upper plate 64 may be spaced apart from the first lower plate 62. The first upper plate 64 may guide an upper portion of the second cable cover 84, the first cable cover 82, the second cable slab 74, and the first cable slab 72. The first upper plate 64 may be an upper guide plate.

The first actuator 66 may be connected to the first lower plate 62. The first actuator 66 may move along a guide rail (not shown). The guide rail may be parallel to the first lower plate 62 and the first upper plate 64. For example, the first actuator 66 may include a first long stroke actuator 65 and a first short stroke actuator 67.

The first long stroke actuator 65 may be provided below the first short stroke actuator 67. As shown in the plan view of FIG. 2, the first long stroke actuator 65 may be wider than the first short stroke actuator 67. The first long stroke actuator 65 may drive the first short stroke actuator 67 to move in a horizontal direction. The first short stroke actuator 67 may be provided on a center of the first long stroke actuator 65. The first short stroke actuator 67 may have a reticle chuck 69 in a center thereof.

The reticle 50 may be provided in the reticle chuck 69. The first short stroke actuator 67 may drive the reticle 50 to move in a horizontal direction (e.g., X and Y directions).

The first cable slab 72, as shown in FIG. 3, may be provided between the first lower plate 62 and the first upper plate 64. A controller 102 may be connected through the first cable slab 72 to one side of the first long stroke actuator 65 of the first actuator 66. The first cable slab 72 may be curved or bent.

Although not shown, each of the first and second cable slabs 72 and 74 may include conductive lines and a cover that surrounds outer peripheries of the conductive lines.

The second cable slab 74 may be provided between the first lower plate 62 and the first upper plate 64. A controller 102 may be connected through the second cable slab 74 to another side of the first long stroke actuator 65 of the first actuator 66. The second cable slab 74 may be bent in a direction toward the first cable slab 72.

The first cable cover 82 may be provided on and below the first cable slab 72. The first cable cover 82 may protect the first cable slab 72. When the first cable slab 72 bends, the first cable cover 82 may prevent or minimize abrasion of the first cable slap 72 against the first lower plate 62. The first cable cover 82 may include Teflon. The first cable cover 82 may not be attached to, but instead be separated from the first cable slab 72. For example, the first cable cover 82 may have a width of about 280 mm and a length of about 680 mm.

Each of the first and second cable covers 82, 84 may include a cable jacket and a cable carrier, but the present inventive concept is not limited thereto. In addition, each of the first and second cable covers 82, 84 may be provided on upper and lower sides of a tube slab (not shown), thereby protecting the tube slab.

The second cable cover 84 may be provided on and below the second cable slab 74. The second cable cover 84 may protect the second cable slab 74. When the second cable slab 74 bends, the second cable cover 84 may prevent or minimize abrasion of the second cable slap 74 against the first lower plate 62. The second cable cover 84 may be the same as the first cable cover 82. For example, the second cable cover 84 may include Teflon.

Each of the first and second cable slabs 72 and 74 in the first and second cable covers 82 and 84 may have a stack structure or a parallel structure. Likewise, the tube slab may have a stack or parallel structure in the first cable cover 82 and the second cable cover 84.

Although not shown in FIGS. 2 and 3, in one embodiment, the first cable cover 82 and the second cable cover 84 may not be coupled to fixing clamps of the first cable slab 72 and the second cable slab.

Figure 4:
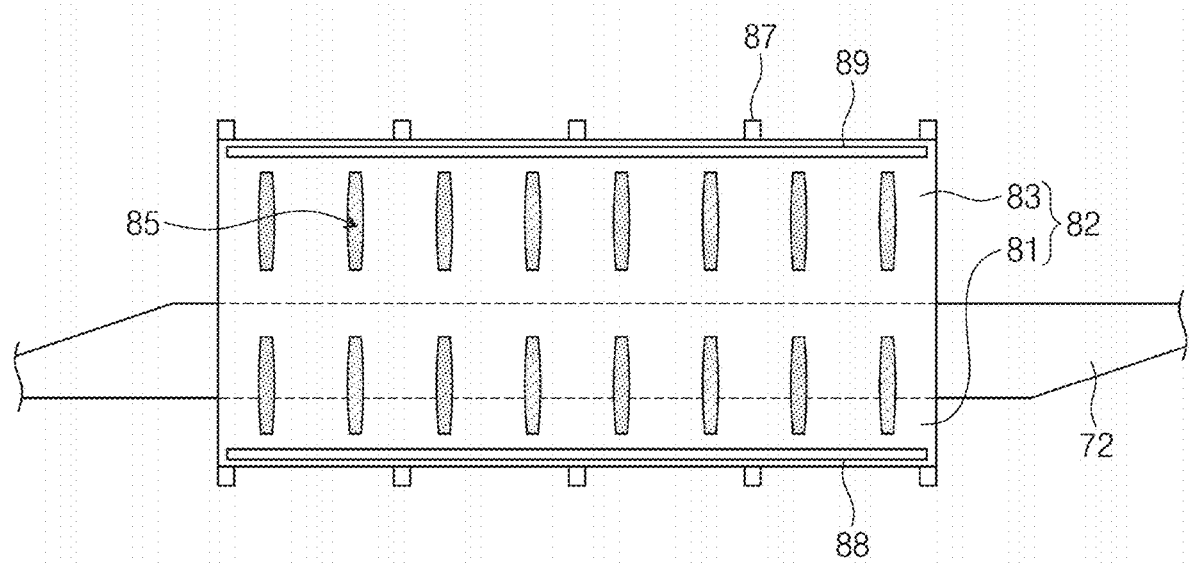
FIGS. 4 and 5 respectively illustrate a development view and a plan view of a first cable cover of the reticle stage as depicted in FIGS. 2 and 3.
Figure 5:
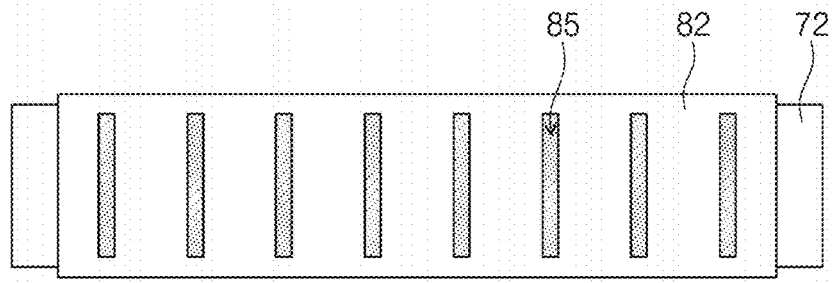

FIGS. 4 and 5 illustrate development and plan views of the first cable cover 82 depicted in FIGS. 2 and 3.

Referring to FIGS. 4 and 5, the first cable cover 82 may include a lower cover 81 and an upper cover 83.

The lower cover 81 may be provided below the first cable slab 72. For example, the lower cover 81 may have a thickness of about 0.75 mm. The lower cover 81 may have folding slits 85. The folding slits 85 may expose a portion of the first cable slab 72. Each of the folding slits 85 may have a rectangular shape when viewed in plan. Each of the folding slits 85 may have a vertical length of about 380 mm and a horizontal length of about 10 mm. The folding slits 85 may have therebetween a distance of about 50 mm to about 100 mm. In addition, the lower cover 81 may have a lower adhesive layer 88 on an edge of a top surface thereof. The lower adhesive layer 88 may include epoxy, but the present inventive concept is not limited thereto.

The upper cover 83 may be provided on the first cable slab 72. For example, the upper cover 83 may have a thickness of about 0.75 mm. The upper cover 83 may have folding slits 85. The upper cover 83 may have an upper adhesive layer 89 on an edge of a bottom surface thereof. The upper adhesive layer 89 may include epoxy.

The lower cover 81 and the upper cover 83 may be replaced in case of emergency or worn out. A knife (not shown) or a pair of scissors (not shown) may be used to separate worn-out lower and upper covers 81, 83 may be separated from the first cable slab 72 or the second cable slab 74. A pair of scissors may be provided on edges of the lower and upper covers 81 and 83 that are on an outer periphery of either the first cable slab 72 or the second cable slab 74. After removing the worn-out lower and upper covers 81, 83, with new lower and upper coves 81, 83 may be provided on the first cable slab 72 or the second cable slab 74. A hand press tool may be utilized to compress and attach the lower cover 81 and the upper cover 83. The hand press tool may heat and compress the lower cover 81 and the upper cover 83.

Each of the lower and upper covers 81, 83 may have handlers 87. The handlers 87 may be provided on edges of each of the lower and upper covers 81 and 83. Each of the handlers 87 may have a tetragonal shape when viewed in plan. Each of the handlers 87 may have a vertical length of about 30 mm and a horizontal length of about 10 mm. The handlers 87 may be usefully employed to align the lower cover 81 and the upper cover 83. In addition, the handlers 87 may be helpfully used to couple the lower cover 81 and the upper cover 83.

The handlers 87 may be removed when the lower and upper covers 81 and 83 are coupled, but the present inventive concept are not limited thereto. As shown In FIG. 5, the handlers 87, the lower adhesive layer 88, and the upper adhesive layer 89 may be omitted on an edge of the first cable slab 72 between the lower cover 81 and the upper cover 83.

Although not shown in FIGS. 4 and 5, the second cable cover 84 may include a lower cover 81 and an upper cover 83, but the present inventive concept is not limited thereto.

Figure 6:
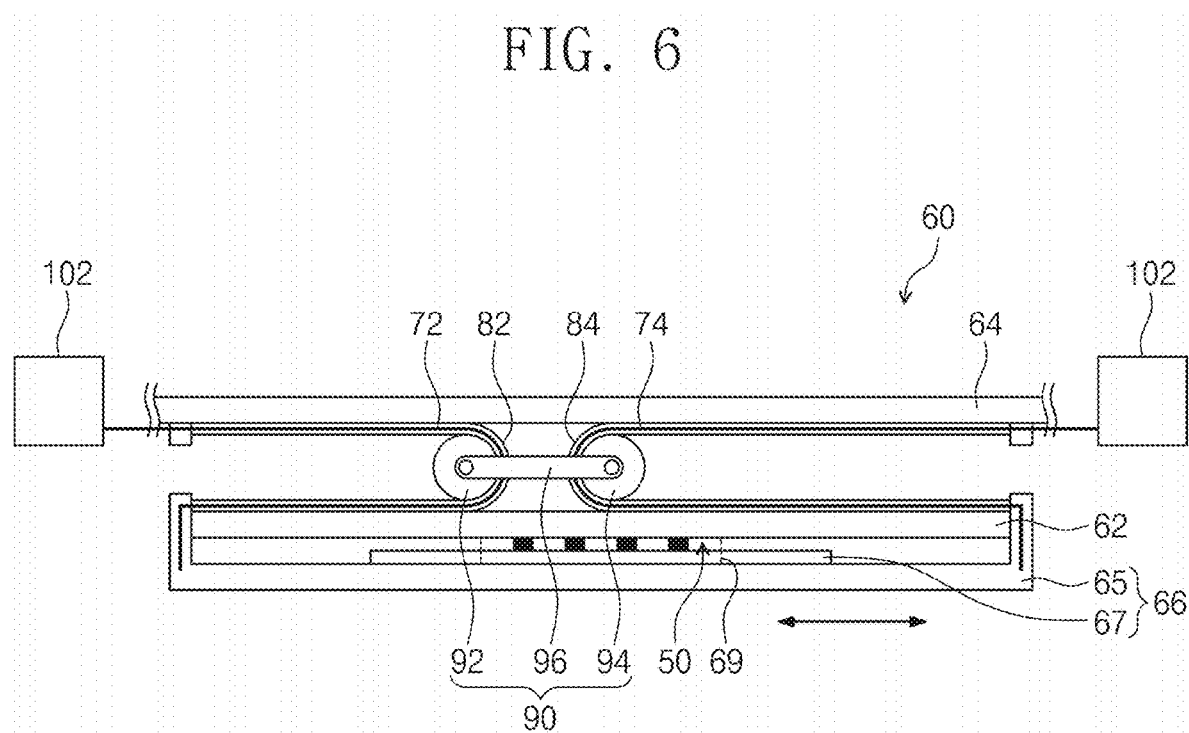
FIG. 6 illustrates a cross-sectional view of a reticle stage of the semiconductor fabrication apparatus as depicted in FIG. 1.

FIG. 6 is a cross-sectional view, the reticle stage 60 depicted in FIG. 1, according to an embodiment.

Referring to FIG. 6, the reticle stage 60 may further include a roller vehicle 90. The roller vehicle 90 may be provided on the first and second cable slabs 72 and 74 that are curved. For example, the roller vehicle 90 may include a first roller 92, a second roller 94, and a connection bar 96.

The first roller 92 may be provided on the first cable slab 72 and the first cable cover 82. For example, the first roller 92 may include a spring roll. Alternatively, the first roller 92 may include a bearing roller, but the present inventive concept is not limited thereto. The first roller 92 may be provided on a curved portion of the first cable slab 72. For example, the first roller 92 may include a spring roll.

The second roller 94 may be provided on the second cable slab 74 and the second cable cover 84. The second roller 94 may be provided on a curved portion of the second cable slab 74. The second roller 94 may be the same as the first roller 92. For example, the second roller 94 may include a spring roll.

The connection bar 96 may connect the first roller 92 to the second roller 94. The connection bar 96 may define a distance between the first roller 92 and the second roller 94. The connection bar 96 may move together with the first and second rollers 92 and 94.

Therefore, the roller vehicle 90 may maintain a constant distance between the first cable slab 72 and the second cable slab 74.

Figure 7:
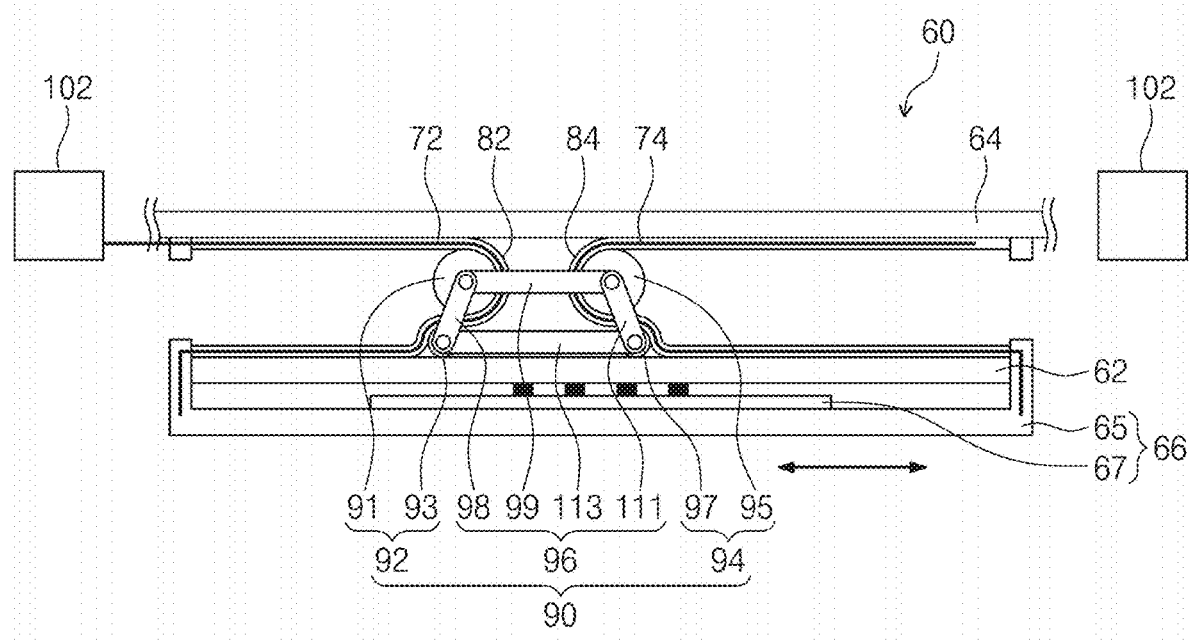
FIG. 7 illustrates a cross-sectional view of a roller vehicle of the reticle stage as depicted in FIG. 6.

FIG. 7 is a cross-sectional view of the roller vehicle 90 depicted in FIG. 6, according to an embodiment.

Referring to FIG. 7, the roller vehicle 90 may be provided on and below each of the first cable slab 72 and the second cable slab 74. The first roller 92 of the roller vehicle 90 may be provided on and below the first cable slab 72. For example, the first roller 92 may include a first upper roller 91 and a first lower roller 93.

The first upper roller 91 may be provided on the first cable slabs 72 and the first cable cover 82. The first upper roller 91 may be provided in curved or bent portions of the first cable slab 72 and the first cable cover 82. The first upper roller 91 may have a diameter greater than that of the first lower roller 93.

The first lower roller 93 may be provided below the first cable slab 72 and the first cable cover 82. The first lower roller 93 may support curved portions of the first cable slab 72 and the first cable cover 82. When the first cable slab 72 and the first cable cover 82 become bent, the first lower roller 93 may reduce loads of the first cable slab 72 and the first cable cover 82 against the first lower plate 62. In addition, the first lower roller 93 may reduce a contact area between the first cable cover 82 and the first lower plate 62, thereby decreasing abrasion of the first cable cover 82. A rotational direction of the first lower roller 93 may be opposite to that of the first upper roller 91.

The second roller 94 of the roller vehicle 90 may be provided on and below each of the second cable slabs 74 and the second cover 84. For example, the second roller 94 may include a second upper roller 95 and a second lower roller 97.

The second upper roller 95 may be provided on the second cable slab 74 and the second cable cover 84. The second upper roller 95 may be provided in curved portions of the second cable slab 74 and the second cable cover 84. The second upper roller 95 may have a diameter greater than that of the second lower roller 97.

The second lower roller 97 may be provided below the second cable slab 74 and the second cable cover 84. The second lower roller 97 may support curved portions of the second cable slab 74 and the second cable cover 84. When the second cable slab 74 and the second cable cover 84 become bent, the second lower roller 97 may reduce loads of the second cable slab 74 and the second cable cover 84 against the first lower plate 62. In addition, the second lower roller 97 may reduce a contact area between the second cable cover 84 and the first lower plate 62, thereby decreasing abrasion of the second cable cover 84. A rotational direction of the second lower roller 97 may be opposite to that of the second upper roller 95 and identical to that of the first lower roller 93.

The first upper roller 91, the first lower roller 93, the second upper roller 95, and the second lower roller 97 may be connected through the connection bar 96 to each other in a tetragonal shape. For example, the connection bar 96 may include a first level connection bar 98, a first horizontal connection bar 99, a second level connection bar 111, and a second horizontal connection bar 113.

The first level connection bar 98 may connect the first upper roller 91 to the first lower roller 93. The first level connection bar 98 may define a distance between the first upper roller 91 to the first lower roller 93. The first level connection bar 98 may be inclined to the first lower plate 62. Alternatively, the first level connection bar 98 may be perpendicular to the first lower plate 62, but the present inventive concept is not limited thereto.

The first horizontal connection bar 99 may connect the first upper roller 91 to the second upper roller 95. The first horizontal connection bar 99 may define a distance between the first upper roller 91 to the second upper roller 95. The first horizontal connection bar 99 may maintain a constant distance between curved portions of the first and second cable slabs 72 and 74.

The second level connection bar 111 may connect the second upper roller 95 to the second lower roller 97. The second level connection bar 111 may define a distance between the second upper roller 95 to the second lower roller 97. The second level connection bar 111 may be inclined relative to the first lower plate 62. Alternatively, the second level connection bar 111 may be perpendicular to the first lower plate 62, but the present inventive concept is not limited thereto.

The second horizontal connection bar 113 may connect the second lower roller 97 to the first lower roller 93. The second horizontal connection bar 113 may define a distance between the first lower roller 93 to the second lower roller 97. The second horizontal connection bar 113 may adjust a contact area between the first cable cover 82 and the first lower plate 62 and may also adjust a contact area between the second cable cover 84 and the first lower plate 62.

According to the present inventive concept, the semiconductor fabrication apparatus 100 may be configured such that the roller vehicle 90 is used to minimize abrasion of the first cable cover 82 and the second cable cover 84.

Figure 8:
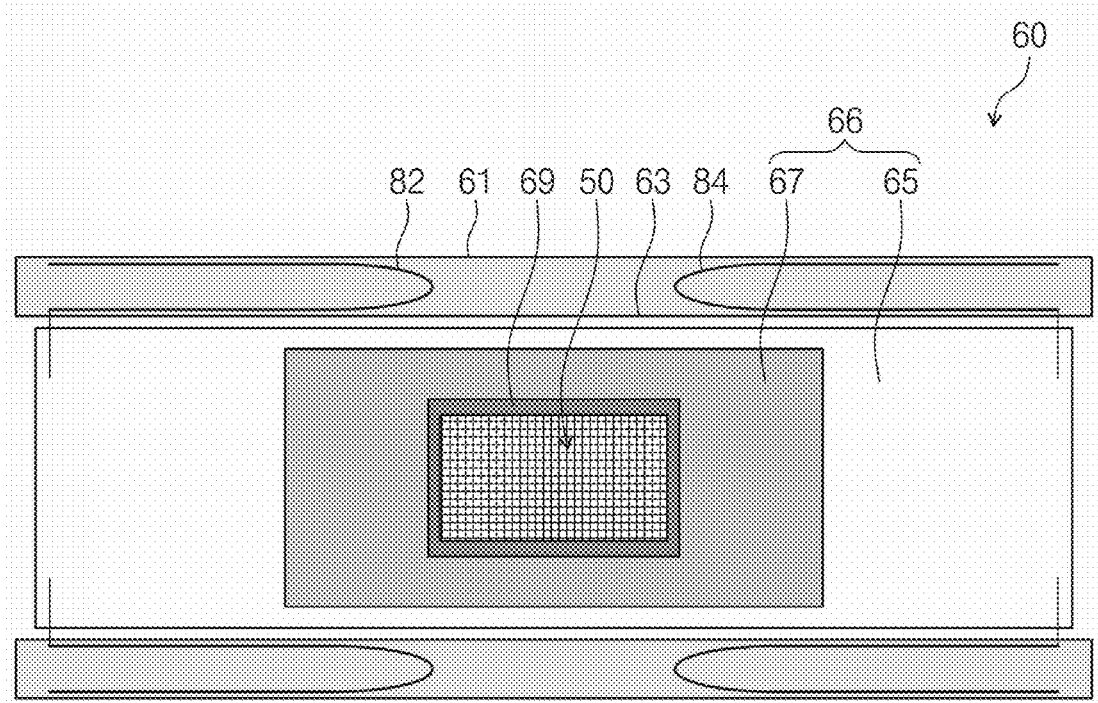
FIG. 8 illustrates a plan view of a reticle stage of the semiconductor fabrication apparatus as depicted in FIG. 1.

FIG. 8 is a view illustrating the reticle stage 60 depicted in FIG. 1, according to an embodiment.

Referring to FIG. 8, the reticle stage 60 may further include first outer plates 61 and first inner plates 63. The first actuator 66 may be configured identically to that of FIG. 2.

The first outer plates 61 may be provided outside opposite sidewalls of the first actuator 66. The first outer plates 61 may be provided on outer peripheries of the first cable cover 82 and the second cable cover 84.

The first inner plates 63 may be provided between the first outer plates 61 and the opposite sidewalls of the first actuator 66. The first inner plates 63 may be parallel to the first outer plates 61.

The first cable cover 82 and the second cable cover 84 may be provided between the first outer plates 61 and the first inner plates 63. The first cable cover 82 and the second cable cover 84 may be folded in a direction parallel to the first actuator 66. For example, the first cable cover 82 and the second cable cover 84 may be folded in a horizontal direction. Although not shown in FIG. 8, the first cable slab (see 72 of FIG. 3) and the second cable slab (see 74 of FIG. 3) may be folded in a horizontal direction.

Referring again to FIG. 1, the substrate stage 20 may be configured identically to the reticle stage 60 of FIGS. 2, 3, and 6 to 8, but the present inventive concept is not limited thereto.

Figure 9:
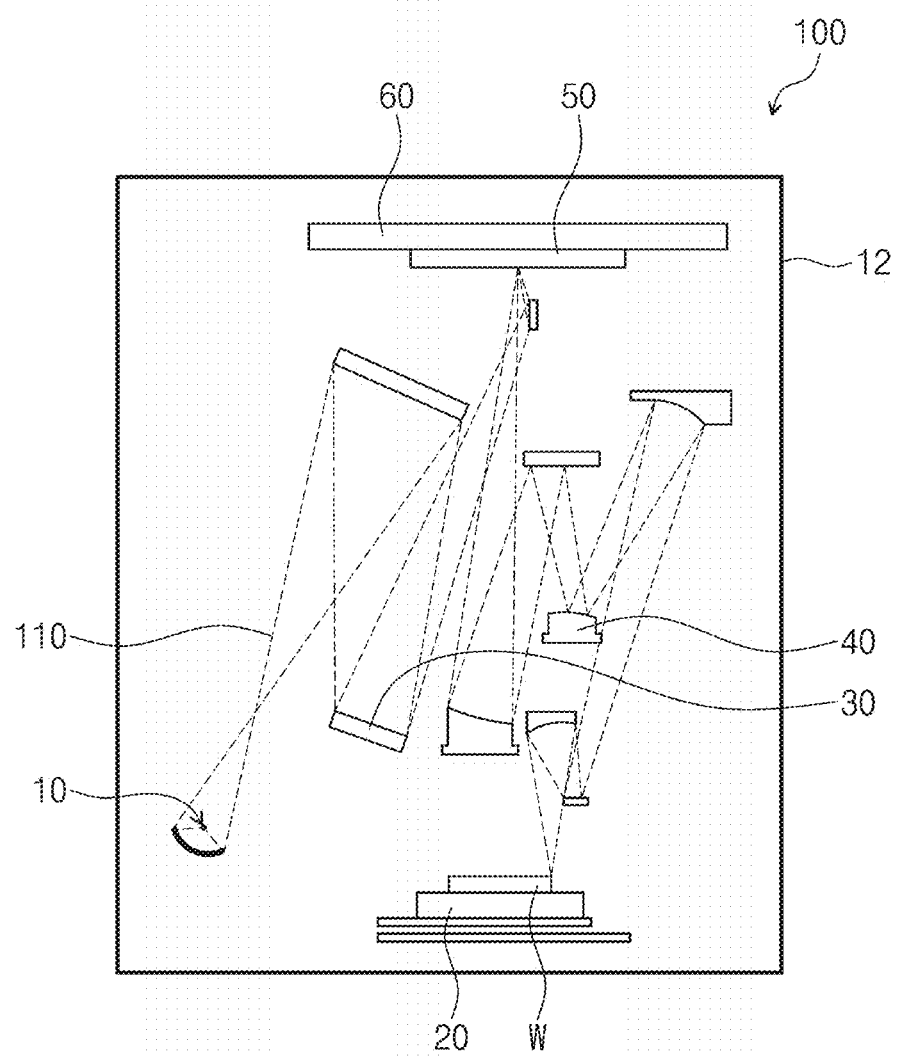
FIG. 9 illustrates a cross-sectional view of a semiconductor fabrication apparatus according to an embodiment of the present inventive concept.

FIG. 9 illustrates the semiconductor fabrication apparatus 100 according to an embodiment of the present inventive concept.

Referring to FIG. 9, a semiconductor fabrication apparatus 100 of the present inventive concept may be an extreme ultraviolet (EUV) exposure device. For example, the semiconductor fabrication apparatus 100, according to the present embodiment, may further include a chamber 12.

The chamber 12 may envelope the light source 10, the substrate stage 20, the illumination optical system 30, the projection optical system 40, the reticle 50, and the reticle stage 60. The chamber 12 may store or hermetically seal plasma (not shown) of the light source 10.

The light source 10 may be provided on one side of a lower portion of the chamber 12. The light 10 may generate either plasma or light 110 of plasma beam. For example, the light source 10 may produce the light 110 by providing pump light to liquid metal droplets of tin (Sn), xenon (Xe), titanium (Ti), or lithium (Li). The light 110 may include an extremely ultraviolet (EUV) beam having a wavelength of about 13.5 nm.

The substrate stage 20 may be provided on a center of the lower portion of the chamber 12. The substrate stage 20 may be provided below the illumination optical system 30 and the projection optical system 40. The substrate stage 20 may receive and move the substrate W.

Figure 10:
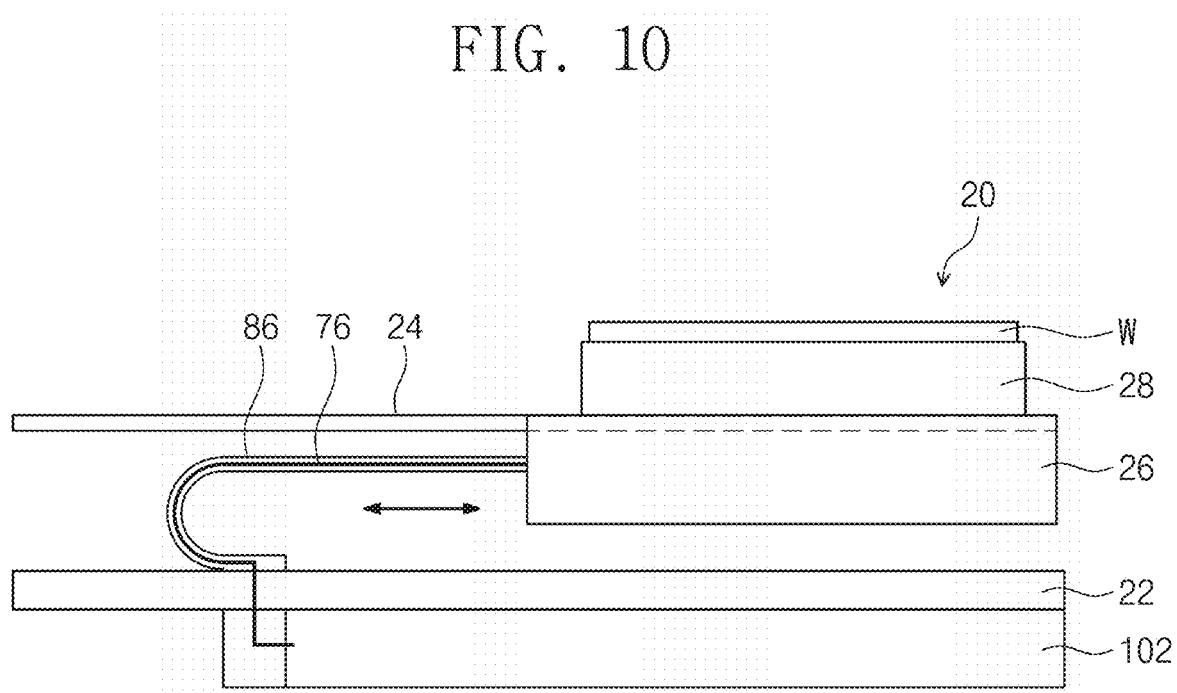
FIG. 10 illustrates a cross-sectional view of a substrate stage of the semiconductor fabrication apparatus as depicted in FIG. 9.

FIG. 10 illustrates the substrate stage 20 of the semiconductor fabrication apparatus as depicted in FIG. 9.

Referring to FIG. 10, the substrate stage 20 may include a second lower plate 22, a second upper plate 24, a second actuator 26, a chucking plate 28, a third cable slab 76, and a third cable cover 86.

The second lower plate 22 may be provided below the second upper plate 24, the second actuator 26, and the chucking plate 28. The second lower plate 22 may be connected to the controller 102. Alternatively, the controller 102 may be separated from the second lower plate 22, but the present inventive concept is not limited thereto.

The second upper plate 24 may be provided on the second lower plate 22. The second upper plate 24 may be parallel to the second lower plate 22. The second upper plate 24 may be utilized as a cover plate.

The second actuator 26 may be coupled to the second upper plate 24. The second actuator 26 may move along a second guide rail (not shown). The second guide rail may be parallel to the second upper plate 24. The second actuator 26 may support the chucking plate 28. The second actuator 26 may drive the chucking plate 28 to move upwards, downwards, leftwards, and rightwards.

Although not shown in FIG. 10, the second actuator 26 may include a second long stroke actuator and a second short stroke actuator. The second long stroke actuator may be provided below the second short stroke actuator. The second long stroke actuator may be wider than the second short stroke actuator. The second long stroke actuator may drive the second short stroke actuator to move in a horizontal direction. The second short stroke actuator may be provided on a center of the second long stroke actuator. The second short stroke actuator may have a substrate chuck in a center thereof. The substrate W may be provided on the substrate chuck. The first short stroke actuator may drive the substrate W to move in a horizontal direction (e.g., X and Y directions).

The chucking plate 28 may be provided on the second upper plate 24 and the second actuator 26. The chucking plate 28 may receive the substrate W. The chucking plate 28 may fix the substrate W, and the second actuator 26 may drive the chucking plate 28 to move the substrate W.

The third cable slab 76 may connect the second actuator 26 to the controller 102. The third cable slab 76 may be provided between the second lower plate 22 and the second upper plate 24. The third cable slab 76 may be curved or bent. A curved portion of the third cable slab 76 may move together with the second actuator 26. Although not shown in FIG. 10, the third cable slab 76 may be provided in plural in a horizontal direction (e.g., X and Y directions).

The third cable cover 86 may surround an outer circumferential surface of the third cable slab 76. The third cable cover 86 may protect the third cable slab 76. The third cable cover 86 may be resistant to plasma. Although not shown, the third cable cover 86 may include a lower cover and an upper cover. The lower cover may be provided below the third cable slab 76. The upper cover may be provided on the third cable slab 76. The lower and upper covers may be coupled and/or attached to each other on an outer periphery of the third cable slab 76. Each of the lower and upper covers may have folding slits. The third cable cover 86 may be provided in plural in a horizontal direction (e.g., X and Y directions).

Referring again to FIG. 9, the illumination optical system 30 may be provided between the light source 10 and the reticle 50. The illumination optical system 30 may reflect the light 110 on the reticle 50. The illumination optical system 30 may include a plurality of flat mirrors.

The projection optical system 40 may be provided between the reticle 50 and the substrate stage 20. The projection optical system 40 may be configured such that the light 110 is reflected to project an image of the reticle 50 on the substrate W. The projection optical system 40 may include one or more of concave mirrors, convex mirrors, and flat mirrors, but the present inventive concept is not limited thereto.

The reticle 50 may be provided in a central upper portion of the chamber 12. Although not shown, the reticle 50 may be provided on the reticle stage 60, while being received in a reticle stocker in the chamber 12. The reticle 50 may reflect the light 110 on the projection optical system 40.

The reticle stage 60 may be provided in a central upper portion of the chamber 12. The reticle stage 60 may fix the reticle 50. The reticle stage 60 may be configured identically to the substrate stage 20. In addition, the reticle stage 60 may be configured identically to that of FIGS. 2, 3, and 6 to 8, but the present inventive concept is not limited thereto.

According to the present inventive concept, the semiconductor fabrication apparatus 100 may be configured such that the first cable cover 82, the second cable cover 84, and the third cable cover 86 are used to prevent or minimize abrasion of the first cable slab 72, the second cable slab 74, and the third cable slab 76.

As discussed above, a semiconductor fabrication apparatus according to some embodiments of the present inventive concept may be configured such that a cable cover surrounding a cable slab is used to prevent or minimize abrasion of the cable slab.

The above descriptions are specific examples for practicing the present inventive concept. The present inventive concept will include not only the embodiments described above but also embodiments that can be easily or simply changed in design. In addition, the present inventive concept will also include technique that can be easily modified and implemented using the embodiments described above.

What is claimed is:

1. A substrate fabrication apparatus, comprising:
   a light source configured to emit light;
   a substrate stage configured to receive a substrate exposed to the light;
   a reticle disposed between the substrate stage and the light source; and
   a reticle stage configured to receive the reticle,
   wherein the reticle stage includes:
   lower plate;
   an upper plate disposed on the lower plate;
   an actuator connected to the lower plate and configured to move in a direction parallel to the upper plate;
   a first cable slab disposed between the upper plate and the lower plate, the first cable slab connected to a first side of the actuator; and
   a first cable cover surrounding an outer periphery of the first cable slab, the cable cover configured to contact the lower plate when the first cable slab is bent.

2. The substrate fabrication apparatus of claim 1, wherein the first cable cover includes:
   a lower cover disposed below the first cable slab; and
   an upper cover disposed on the first cable slab and on an edge of the lower cover on an outer periphery of the first cable slab.

3. The substrate fabrication apparatus of claim 2, wherein each of the upper cover and the lower cover includes a plurality of folding slits that expose portions of the first cable slab.

4. The substrate fabrication apparatus of claim 3, wherein each of the plurality of folding slits has a rectangular shape.

5. The substrate fabrication apparatus of claim 1, wherein the reticle stage further includes:
   a second cable slab disposed between the upper plate and the lower plate, the second cable slab connected to a second side of the actuator; and
   a second cable cover surrounding an outer periphery of the second cable slab, the second cable cover configured to contact the lower plate when the second cable slab is bent.

6. The substrate fabrication apparatus of claim 5, wherein the reticle stage further includes a roller vehicle disposed on the first cable slab and the second cable slab, the roller vehicle configured to move together with the actuator.

7. The substrate fabrication apparatus of claim 6, wherein the roller vehicle includes:
   a first roller disposed on the first cable cover;
   a second roller disposed on the second cable cover; and
   a connection bar configured to connect the first roller to the second roller.

8. The substrate fabrication apparatus of claim 7, wherein the first roller includes:
   a first upper roller disposed on the first cable cover; and
   a first lower roller disposed below the first cable cover.

9. The substrate fabrication apparatus of claim 8, wherein the second roller includes:
   a second upper roller disposed on the second cable cover; and
   a second lower roller disposed below the second cable cover.

10. The substrate fabrication apparatus of claim 9, wherein the connection bar includes:

an upper connection bar disposed between the first upper roller and the second upper roller;
a first connection bar disposed between the first upper roller and the first lower roller;
a lower connection bar disposed between the first lower roller and the second lower roller; and
a second connection bar disposed between the second upper roller and the second lower roller.

11. A semiconductor fabrication apparatus, comprising:
a chamber;
a light source in the chamber configured to emit light;
a substrate stage configured to receive a substrate exposed to the light;
a reticle disposed between the substrate stage and the light source; and
a reticle stage configured to receive the reticle,
wherein the substrate stage includes:
    a lower plate;
    an upper plate disposed on the lower plate;
    an actuator connected to the lower plate moving in a direction parallel to the upper plate;
    a cable slab between the upper plate and the lower plate, the cable slab being connected to a first side of the actuator; and
    a cable cover surrounding an outer periphery of the cable slab, the cable cover configured to contact the lower plate when the cable slab is bent.

12. The semiconductor fabrication apparatus of claim 11, wherein the cable cover includes Teflon.

13. The apparatus of claim 11, wherein the cable cover includes:
    a lower cover disposed below the cable slab; and
    an upper cover disposed on the cable slab and an edge of the lower cover on an outer periphery of the cable slab.

14. The substrate fabrication apparatus of claim 13, wherein each of the upper cover and the lower cover has a plurality of folding slits exposing portions of the cable slab.

15. The substrate fabrication apparatus of claim 14, wherein each of the folding slits has a rectangular shape.

16. A semiconductor fabrication apparatus, comprising:
a light source configured to emit light;
a substrate stage configured to receive a substrate exposed to the light emitted from the light source;
a reticle disposed between the substrate stage and the light source; and
a reticle stage configured to receive the reticle,
wherein the reticle stage includes:
    a first lower plate;
    a first upper plate disposed on the first lower plate;
    a first actuator connected to the first lower plate and configured to move in a direction parallel to the first upper plate;
    a first cable slab disposed between the first upper plate and the first lower plate, the first cable slab connected to a first side of the first actuator;
    a first cable cover surrounding an outer periphery of the first cable slab configured to contact the first lower plate when the first cable slab is bent;
    a second cable slab disposed between the first upper plate and the first lower plate connected to a second side of the first actuator;
    a second cable cover surrounding an outer periphery of the second cable slab configured to contact the first lower plate when the second cable slab is bent; and
    a roller vehicle disposed on the first cable slab and the second cable slab, the roller vehicle configured to move together with the first actuator.

17. The semiconductor fabrication apparatus of claim 16, wherein the roller vehicle includes:
    a first roller disposed on the first cable cover;
    a second roller disposed on the second cable cover; and
    a connection bar configured to connect the first roller to the second roller.

18. The semiconductor fabrication apparatus of claim 17, wherein the first roller includes:
    a first upper roller disposed on the first cable cover; and
    a first lower roller disposed below the first cable cover.

19. The semiconductor fabrication apparatus of claim 18, wherein the second roller includes:
    a second upper roller disposed on the second cable cover; and
    a second lower roller disposed below the second cable cover.

20. The semiconductor fabrication apparatus of claim 19, wherein the connection bar includes:
    an upper connection bar disposed between the first upper roller and the second upper roller;
    a first connection bar disposed between the first upper roller and the first lower roller;
    a lower connection bar disposed between the first lower roller and the second lower roller; and
    a second connection bar disposed between the second upper roller and the second lower roller.

* * * * *